United States Patent
Chew et al.

(10) Patent No.: US 6,550,666 B2
(45) Date of Patent: Apr. 22, 2003

(54) METHOD FOR FORMING A FLIP CHIP ON LEADFRAME SEMICONDUCTOR PACKAGE

(75) Inventors: Jimmy Hwee Seng Chew, Singapore (SG); Kim Hwee Tan, Singapore (SG)

(73) Assignee: Advanpack Solutions Pte LTD, Singapore (SG)

( * ) Notice: Subject to any disclaimer, the term of this patent is extended or adjusted under 35 U.S.C. 154(b) by 0 days.

(21) Appl. No.: 09/934,019

(22) Filed: Aug. 21, 2001

(65) Prior Publication Data

US 2003/0038162 A1 Feb. 27, 2003

(51) Int. Cl.$^7$ ............................................. B23K 31/02
(52) U.S. Cl. .................. 228/180.22; 228/207; 228/215; 228/223; 228/254
(58) Field of Search .................. 228/180.21, 180.22, 228/207, 223, 245, 254, 248.1, 214, 215

(56) References Cited

U.S. PATENT DOCUMENTS

| 4,914,814 | A | * | 4/1990 | Behun et al. ............... 174/263 |
| 5,634,268 | A | * | 6/1997 | Dalal et al. ............ 228/180.22 |
| 5,640,052 | A | * | 6/1997 | Tsukamoto ................. 257/738 |
| 5,723,904 | A | * | 3/1998 | Shiga ......................... 257/698 |
| 5,747,101 | A | * | 5/1998 | Booth et al. ........... 228/180.22 |
| 5,796,591 | A | * | 8/1998 | Dalal et al. ............ 228/180.22 |
| 5,889,326 | A | * | 3/1999 | Tanaka ....................... 257/737 |
| 6,011,313 | A | * | 1/2000 | Shangguan et al. .... 228/180.22 |
| 6,024,275 | A | * | 2/2000 | Takiar ........................ 164/322 |
| 6,082,610 | A | * | 7/2000 | Shangguan et al. .... 228/180.22 |
| 6,107,180 | A | * | 8/2000 | Munroe et al. ............... 29/840 |
| 6,114,187 | A | * | 9/2000 | Hayes ..................... 228/179.1 |
| 6,165,885 | A | * | 12/2000 | Gaynes et al. ............... 257/737 |
| 6,177,636 | B1 | * | 1/2001 | Fjelstad ....................... 174/260 |
| 6,196,443 | B1 | * | 3/2001 | DiGiacomo ............. 228/180.22 |
| 6,250,541 | B1 | * | 6/2001 | Shangguan et al. .... 228/180.22 |
| 6,303,872 | B1 | * | 10/2001 | Jairazbhoy et al. ......... 174/260 |
| 6,337,445 | B1 | * | 1/2002 | Abbott et al. ............... 174/257 |
| 6,344,234 | B1 | * | 2/2002 | Dalal et al. ................. 205/125 |
| 6,350,668 | B1 | * | 2/2002 | Chakravorty ............... 438/124 |
| 6,363,295 | B1 | * | 3/2002 | Akram et al. ............... 700/116 |
| 6,372,624 | B1 | * | 4/2002 | Farnworth et al. .......... 438/612 |
| 6,380,555 | B1 | * | 4/2002 | Hembree et al. ............. 257/48 |
| 6,395,097 | B1 | * | 5/2002 | Maheshwari et al. ....... 134/182 |

FOREIGN PATENT DOCUMENTS

EP  1080889 A2 * 3/2001

* cited by examiner

Primary Examiner—M. Alexandra Elve
Assistant Examiner—Kiley Stoner
(74) Attorney, Agent, or Firm—Conley Rose, P.C.

(57) ABSTRACT

A predetermined amount of solder (315) is deposited on the free ends of copper posts (310) extending from die pads of a semiconductor die (305). The solder (315) is coated with flux (320) and the semiconductor die (305) is placed on a leadframe (100) with the solder deposits (315) abutting interconnect locations (335) on inner lead portions (101). When reflowed, the solder deposits (315) melt and with the assistance of the flux (320) forms solder interconnects between the free ends of the copper posts (310) and the interconnect locations (335). Due to the predetermined amount of solder (315) deposited on the free ends of the copper posts (310), the molten solder (315) tends not to flow away from the interconnect location (335). Thus, advantageously allowing a substantial portion of the solder deposit (315) to remain at the interconnect locations (335) to form solder interconnects.

23 Claims, 3 Drawing Sheets

METHOD FOR FORMING A FLIP CHIP ON LEADFRAME SEMICONDUCTOR PACKAGE

FIELD OF THE INVENTION

The present invention relates to forming a flip chip semiconductor package on a leadframe, and more particularly to forming a flip chip semiconductor package with a bumped semiconductor die on a leadframe.

BACKGROUND OF THE INVENTION

In semiconductor packaging, a relatively sensitive and difficult to handle semiconductor die is encapsulated in a package with external connections. Packaging allows the semiconductor die to be more conveniently handled, and it also allows external circuitry to be easily coupled thereto.

A known method of forming a flip chip on leadframe (FCOL) semiconductor package employs a plated leadframe. A leadframe is a patterned sheet of metal, typically copper, that has been plated, usually with silver, nickel or palladium. Conventionally, a leadframe is plated to prevent the copper from oxidizing, and to provide a surface to which solder will adhere. The pattern of the sheet of metal provides a leadframe for forming a semiconductor package.

Currently, leadframes for forming FCOL semiconductor packages have leads with inner lead portions and outer lead portions. The inner lead portions are arranged in a pattern with interconnect locations on the inner lead portions matching the pattern of pads on a semiconductor die. During the packaging process, typically eutectic solder is deposited on the interconnect locations. In addition, the pads on the semiconductor die are bumped. Bumping can comprise metal posts extending from the pads of the semiconductor die with solder balls on free ends of the metal posts. Typically, the solder balls are made of high lead solder.

U.S. patent application Ser. No. 09/564,382 by Francisca Tung, filed on Apr. 27, 2000, titled "Improved Pillar Connections For Semiconductor Chip", and Continuation-In-Part U.S. patent application Ser. No. 09/843,248 by Francisca Tung, filed on Apr. 27, 2001 titled "Pillar Connections For Semiconductor Chips and Method Of Manufacture", and assigned to a common assignee as this patent application, teaches forming pillar bump structures as described herein. These patent applications are incorporated herein by reference thereto.

Subsequently, the solder balls on the die, and the semiconductor die is flipped over, and placed on the leadframe, with the solder balls abutting the solder paste deposits on the interconnect locations. The assembly is then reflowed using an appropriate reflow profile.

Under the elevated reflow temperatures, the solder paste deposits melt, and with the assistance of the flux, the eutectic solder adheres to the interconnect locations on the leadframe and the high lead solder balls on the copper posts, thus forming solder interconnects between the high lead solder balls on the free ends of the metal posts and the interconnect locations on the leadframe. After reflow, when normal flux is used the assembly is cleaned to remove residual flux and encapsulated in mold compound. However, when no-clean flux is employed, the cleaning step is not necessarily required. The resultant package is known as a FCOL semiconductor package.

A disadvantage of this process is, when the solder paste melts, the molten solder tends to flows across the surface of the lead portions. This flow of solder is often referred to as overrun, and results in a variety of adverse effects in FCOL semiconductor packages.

A first concern is, when the solder flows away from an interconnect location, the respective solder interconnect constitutes less solder than required to provide a reliable electrical connection between the solder balls and the interconnect locations. A second concern is, solder interconnects formed with the reduced amount of solder do not support the semiconductor die evenly on the leadframe. Consequently, the planarity of the semiconductor die on the leadframe is adversely affected, and a non-planar die can give rise to shorting between the metal posts on the die. This condition is sometimes referred to as a collapsed die.

A third concern is the overrun results in solder flowing over the edges and onto the opposite surface of the lead portions. Later, during molding mold compound will not adhere well to the affected surfaces. A fourth concern is wicking, which occurs when a lead portion on a leadframe is shaped such that there is a small gap between the side of a downset die and the lead portion, and where there is an interconnect location close to the edge of the die. In this arrangement, the solder from the interconnect location can flow along the lead portion and, through capillary action, flow upwards through the small gap.

Further, eutectic solder paste is disposed on the interconnect locations using a printing process. This process of dispensing solder is known to suffer wide process variations. Consequently, the amount of solder paste dispensed on a leadframe can vary considerably. Such variations in the amount of solder paste dispensed for a particular semiconductor package leads to variations in the resultant solder joints, adversely affecting the reliability of the semiconductor package.

In an effort to reduce costs of producing FCOL semiconductor packages, un-plated or bare copper leadframes, simply referred to as copper leadframes, have been tried. However, to a large extent, the copper leadframes suffer the same disadvantages discussed hereinabove as the plated leadframe, and in some instances to a greater degree.

BRIEF SUMMARY OF THE INVENTION

The present invention seeks to provide a method for forming a flip chip on leadframe semiconductor package, which overcomes or at least reduces the abovementioned problems of the prior art.

Accordingly, in one aspect, the present invention provides a method for forming a flip chip semiconductor package, the method comprising the steps of:

a) providing a patterned layer of metal conductors having a first surface for providing a pattern of interconnect locations thereon;

b) providing a semiconductor die having a first surface with a corresponding pattern of pads thereon, the pads having non-reflowable material thereon:

c) disposing a predetermined amount of reflowable conductive material on the non-reflowable material;

d) placing the semiconductor die on the patterned layer of metal conductors, wherein the reflowable conductive material abuts the interconnect locations; and e) reflowing the reflowable conductive material, wherein a substantial portion of the reflowable conductive material remains substantially at the interconnect locations to form conductive interconnects between the non-reflowable material and the interconnect locations.

In another aspect the present invention provides a method for determining the amount of reflowable material to be disposed on non-reflowable bumps on a semiconductor die to mount the semiconductor die on a leadframe having interconnect locations thereon, the method comprising the steps of:

a) determining surface area of one of the non-reflowable bumps;

b) defining a corresponding interconnect location on the leadframe having substantially the same area as the surface area of the one of the non-reflowable bumps; and c) selecting an amount of reflowable material such that a substantial portion of the selected amount of reflowable material remains at the interconnect location during reflow.

BRIEF DESCRIPTION OF THE DRAWINGS

An embodiment of the present invention will now be more fully described, by way of example, with reference to the drawings of which.

DETAIL DESCRIPTION OF THE DRAWINGS

A predetermined amount of solder is deposited more uniformly on the free ends of copper posts extending from die pads of a semiconductor die. The solder deposits are coated with flux and the semiconductor die is then placed on a leadframe with the solder deposits abutting interconnect locations on inner lead portions of the leadframe. When reflowed, the solder deposits melt and with the assistance of the flux forms solder interconnects between the free ends of the copper posts and the interconnect locations. Due to the predetermined amount of solder deposited on the free ends of the copper posts more uniformly, the molten solder tends not to flow away from the interconnect locations. Thus, advantageously allowing a substantial portion of the solder to remain at the interconnect locations resulting in more uniform solder interconnects. After forming the solder interconnects, the assembly of the semiconductor die and the leadframe is encapsulated in mold compound with outer lead portions exposed and/or extending from the FCOL semiconductor package. A non-leaded version of the resultant package is often referred to as the quad non-lead package (QFN).

Figure 1:
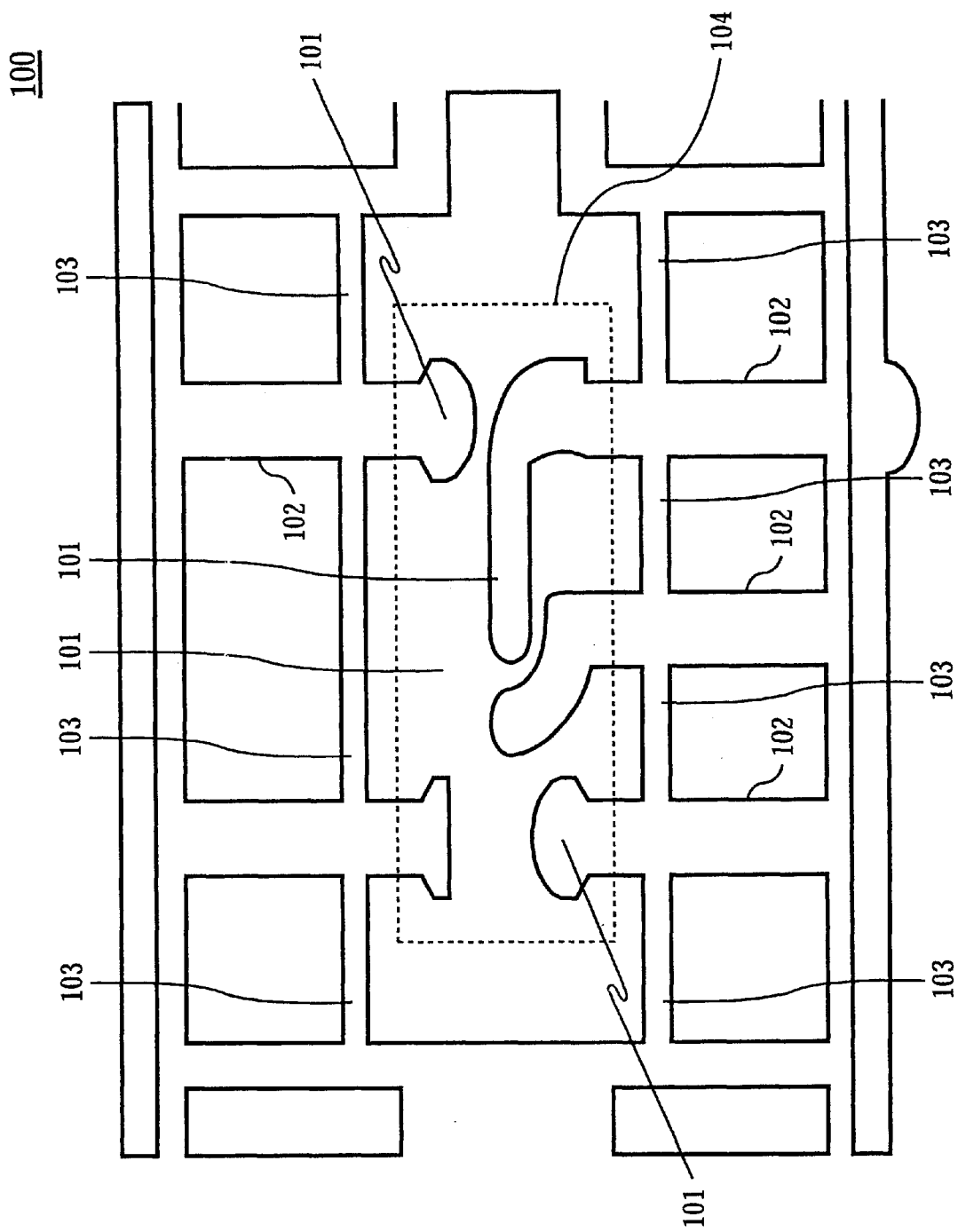
FIG. 1 shows a top view of a part of a leadframe.
Figure 2:
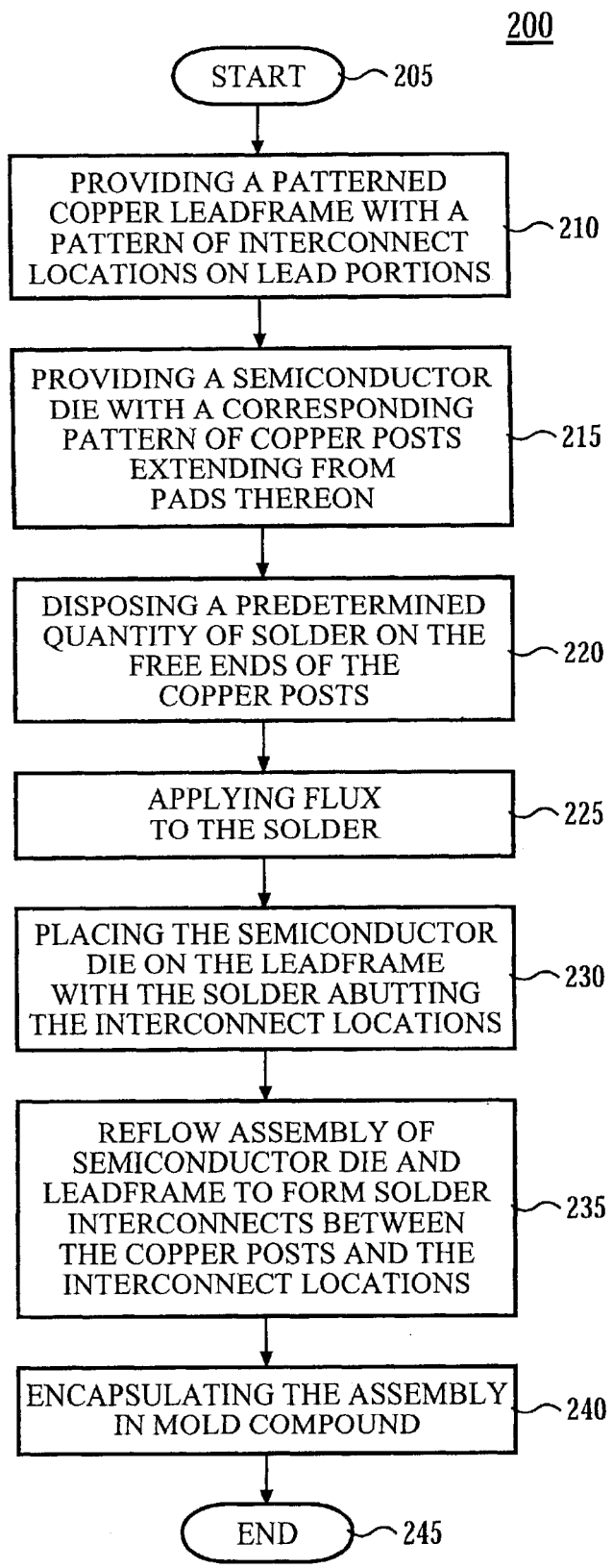
FIG. 2 shows a flowchart detailing a process for forming a FCOL semiconductor package with a semiconductor die and a leadframe.

FIG. 1 shows a part of a leadframe 100, which has inner lead portions 101, outer lead portions 102 and dam bar portions 103. The outline 104 indicates the location for placing a flipped semiconductor die (not shown) on the leadframe 100. After a FCOL semiconductor package (not shown) is formed on the leadframe 100, the inner lead portions 101, which are coupled to the semiconductor die, will be enclosed with the semiconductor die in the FCOL semiconductor package, and th e , outer lead portions 102 will extend from the package. The dam bar portions 103 define an outline of the FCOL package, and provide a seal during the molding process that encapsulates the semiconductor die and the inner lead portions 102 in the FCOL package. The dam bar portions 103 and other excess portions of the lead frame 100 are removed during a subsequent trim and form operation after encapsulation or when the FCOL semiconductor package is singulated from the leadframe 100. lypically, the leadframe 100 is supplied by a vendor in a strip on which several FCOL semiconductor packages can be formed, as is known in the art. More commonly, the leadframe comprises copper and is plated with silver, nickel or palladium, however, the present invention also extends to use with un-plated leadframes, such as bare copper leadframes.

The leadframe 100 is a patterned metal leadframe, which provides a patterned layer of metal conductors, and can comprise a stamping from a sheet of metal, such as copper. Alternatively, the leadframe 100 can be produced by etching a copper sheet. When the thickness of the metal is relatively small, the leadframe 100 can comprise flexible circuits, also known as flex circuits, which includes a flexible substrate. In addition, the leadframe 100, as referred to herein, extends to substrates including ceramic, laminate, polyimide substrate, and tape.

With reference to FIG. 2 and FIGS. 3A–D a process 200 for forming a FCOL semiconductor package, in accordance with the present invention, starts 205 with providing 210 the copper leadframe 100. To facilitate description, only a portion of the lead frame 100 and a portion of a semiconductor die 305 are shown in FIGS. 3A–D. However, it will be appreciated by one skilled in the art, that the process 200 as described applies to all copper posts 310 on the semiconductor die 305 and all the inner lead portions 101 of the leadframe 100 that form the FCOL semiconductor package.

Figure 3A:
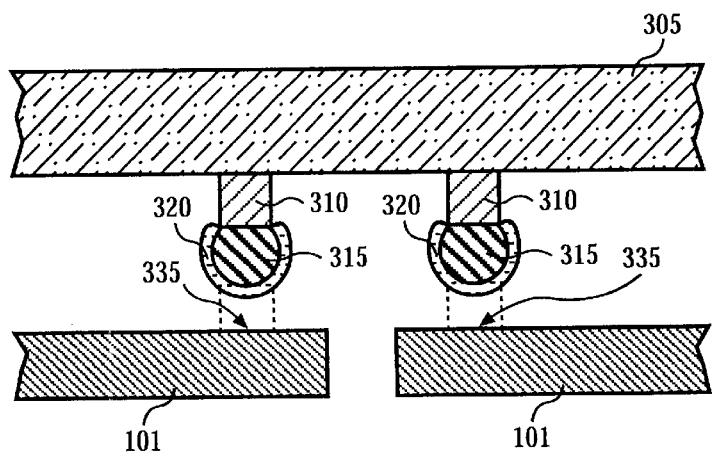
FIGS. 3A–D shows cross-sectional views of a part of the leadframe and the semiconductor die during the process in FIG. 1.

Next the semiconductor die 305 is provided 215, where the semiconductor die 305 includes copper posts 310 extending from pads (not shown) on the semiconductor die 305 as shown in FIG. 3A. A process for forming the copper posts 310 on the semiconductor die 305 when the die is part of a semiconductor wafer was alluded to earlier. A variety of other wafer bumping techniques may be employed to form non-reflowable bumps on a wafer, and the constituent bumped semiconductor dies of such wafers can be used in accordance with the present invention to form FCOL semiconductor packages. Examples of such non-reflowable bumps include gold, indium, tin, lead-free tin bismuth, lead free tin-copper, lead free tin-silver, and the like.

In addition, FIG. 3A shows the inner lead portions 101 of two adjacent leads of the leadframe 100 where each of the inner lead portions 101 has an interconnect location 335 thereon. An interconnect location herein is defined as the area on the inner lead portion 101 when the copper posts 310 are aligned with the inner lead portions 101 i.e. the area bounded by the circumference of the copper posts 310 when the copper posts are aligned with the inner lead portions 101, where the circumference of the copper posts are projected onto the inner lead portions 101. The broken lines in FIGS. 3A and 3C define the interconnect locations 335 on the inner lead portions 101. The pattern of interconnect locations 335 on the inner lead portions 101 corresponds to the pattern of copper posts 310 that extend from the semiconductor die 305 when the semiconductor die 315 is aligned with the inner lead portions 101.

Subsequently, reflowable conductive deposits 315, such as solder, is plated on or attached in the form of solder balls, on the free ends of the copper posts 310. In this way the solder deposits 315 are disposed 220 on the free ends of the copper posts 310. The solder deposits 315 can be disposed by a variety of techniques, as will be known to one skilled in the art. A reference cited earlier describes a process that disposes solder on the copper posts when the copper bumps are formed by electroplating.

The amount of solder disposed on the end of each of the copper posts 310 of the semiconductor die 305 is predetermined, and whatever process that is employed to dispose the solder, that process must ensure that the predetermined amount of solder is disposed on each of the copper post 310. Here, a plating process is used as the plating process has a lower process variation then that of the solder printing process. This allows the amount of solder disposed on the free ends of the copper posts to be better controlled and more uniform on a semiconductor die. The amount of solder disposed is dependent on a variety of factors which can include: type of solder, dimensions of the copper post, material at the interconnect location, mass of the semiconductor die, number of copper posts, reflow profile when reflowing the solder deposits 315, the expected final dimensions of the reflowed solder and copper post, and the type of flux. This measured amount of the solder, advantageously allows a substantial portion of the disposed solder deposits 315 to remain at the interconnect locations 335 during reflow when the solder deposits 315 are in molten state.

Flux 320 is then applied or coated 225 on the solder deposits 315. This is often achieved by briefly positioning the semiconductor die 305 with the solder deposits 315 immersed in a reservoir of the flux 320. At elevated temperatures, the flux 320 cleans a surface to which it is applied to enhance the adhesion of the solder deposits 315. The cleaned surfaces include the surface of the solder deposit 315 and the interconnect locations 335.

After the flux 320 is applied, the semiconductor die 305 is ready to be mounted on the leadframe 100. Alternatively, the flux 320 can be printed or disposed on the interconnect locations 335, although this would require additional equipment relative to a single handler picking up the semiconductor die 305 with the solder, dipping the solder deposits 315 on the copper posts 310 in flux 320 and then placing the semiconductor die 305 on the leadframe 100.

After applying the flux 320, the semiconductor die 305 is positioned above the leadframe 100 with the solder deposits 315 aligned with the interconnect locations 335 on the leadframe 100. The semiconductor die 305 is then placed 230 on the leadframe 100. The step of placing here can include exerting and maintaining a predetermined force on the semiconductor die 305 against the leadframe 100.

Figure 3B:
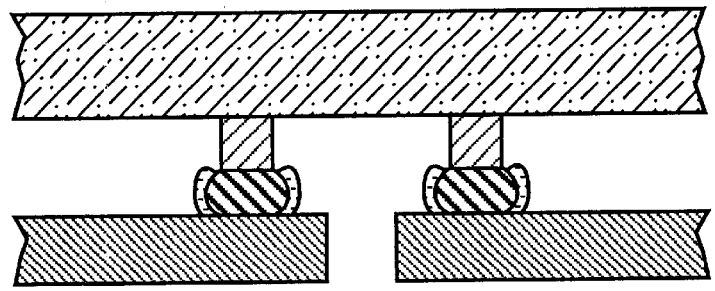

When the semiconductor die 305 is placed on the leadframe 100, the lower surface of the solder deposits 315 abut the interconnect locations 335, and the flux 320 on the solder deposits 315 flows around the solder deposits 315 and on the interconnect locations 335. The flux 320 on the solder deposits 315 wets or adheres to the interconnect locations 335 as shown in FIG. 3B, in preparation for the next step.

Figure 3C:
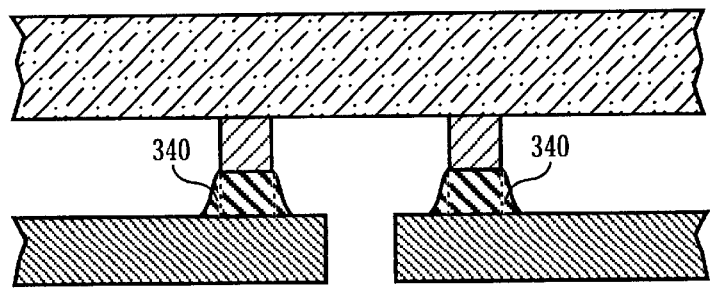

The assembly of the semiconductor die 305, the leadframe 100, and the flux 320, is then reflowed 235. Reflowing processes will be known to one skilled in the art in relation to flip chip semiconductor packages, and no further detail is provided herein, except to the extent where such detail enhances the understanding of the present invention. During reflow 235, the flux 320 cleans the interconnect locations 335 on the leadframe 100, and the solder deposits 315 change to a molten state. The molten solder flows onto the cleaned interconnect locations 335, and adheres thereto forming a solder interconnect 340 between each of the copper posts 310 and the corresponding interconnect locations 335, as shown in FIG. 3C.

The solder interconnect 340 is sometimes called a fillet. The predetermined amount of solder 315 deposited determines the formation of the solder interconnect 340, thus ensuring a substantial portion of the solder 315 deposited remains at the interconnect location 335.

Consequently, there is more solder at the interconnect locations 335, which increases the mechanical strength of the coupling between the copper posts 310 and the leadframe 100, thus producing more reliable electrical coupling.

Hence, the present invention, as described, advantageously, reduces the flow of solder away from the interconnect locations, thus, improving the coupling between the copper posts and the leadframe formed by the resultant solder interconnects.

Figure 3D:
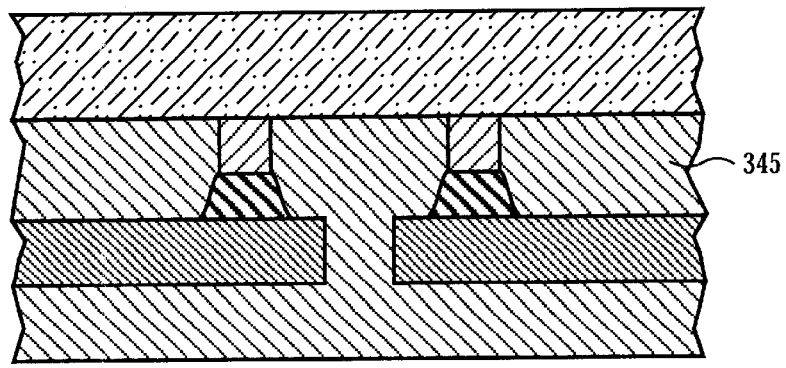

After reflowing 235, when normal flux is used, the assembly is cleaned to remove any access flux 320, and the assembly is encapsulated 245 in mold compound 345 as shown in FIG. 3D, to produce a flip chip semiconductor package (not shown) on the leadframe 100. Alternatively, when no-clean flux is employed, cleaning is not necessarily required. Subsequently, after a final step of singulating the FCOLF semiconductor package from the leadframe 100, during which the dam bar portions 103 are severed, the process 200 ends 245. As will be known to one skilled in the art, there may be the additional steps of forming the external lead portions 102, and testing the functionality of the semiconductor die 320, prior to singulation.

An example of a semiconductor package formed in accordance with the present invention comprises a semiconductor die with copper post having a pitch of 250 microns, where the copper post has a length of 70 microns and a diameter of 100 microns. The solder plated on the free ends of the copper posts has a thickness of 30 microns, and the semiconductor die was mounted on a bare copper leadframe.

The present invention, as described, provides a method of forming a flip chip semiconductor package on a leadframe where a predetermined amount of solder disposed on the copper posts on a semiconductor die tends to remain at interconnect locations on the leadframe.

This is accomplished by determining the amount of solder to be disposed taking into account a variety of factors including type of solder, the dimensions of the metal post, the material at the interconnect location, the mass of the die, the number of metal posts, the reflow profile, the expected final dimensions of the reflowed solder and copper post and the type of flux.

Thus, the present invention, as described provides a method for forming a flip chip on leadframe semiconductor package, which overcomes or at least reduces the above-mentioned problems of the prior art.

It will be appreciated that although only one particular embodiment of the invention has been described in detail, various modifications and improvements can be made by a person skilled in the art without departing from the scope of the present invention.

What is claimed is:

1. A method for forming a flip chip semiconductor package, the method comprising the steps of:
   a) providing a patterned layer of metal conductors having a first surface;
   b) providing a semiconductor die having a first surface with a pattern of pads thereon, the pads having non-reflowable material thereon, wherein the pattern of pads is different from the patterned layer of metal conductors, and wherein the non-reflowable material melts at a temperature that is higher than a predetermined reflow temperature;
   c) disposing a predetermined amount of reflowable conductive material on free-ends of the non-reflowable material on each of the pads, wherein the reflowable conductive material melts at the predetermined reflow temperature;

d) placing the semiconductor die on the first surface of the patterned layer of metal conductors, wherein the reflowable conductive material on the non-reflowable material on each of the pads abut the patterned layer of metal conductors to form a pattern of interconnect locations on the patterned layer of metal conductors, and wherein the pattern of interconnect locations correspond with the pattern of pads; and e) reflowing the reflowable conductive material at the predetermined reflow temperature, wherein a substantial portion of the reflowable conductive material on the non-reflowable material on the each of the pads remains substantially at the respective interconnect locations to form conductive interconnects between the non-reflowable material and the interconnect locations.

2. A method in accordance with claim 1 wherein step (c) comprises the step of determining the predetermined amount of reflowable conductive material based on material composition of the reflowable conductive material.

3. A method in accordance with claim 1 wherein step (c) comprises the step of determining the predetermined amount of reflowable conductive material based on material composition of the interconnect locations.

4. A method in accordance with claim 1 wherein step (c) comprises the step of determining the predetermined amount of reflowable conductive material based on material composition of the non-reflowable material.

5. A method in accordance with claim 1 wherein step (c) comprises the step of determining the predetermined amount of reflowable conductive material based on dimensions of the non-reflowable material.

6. A method in accordance with claim 1 wherein step (c) comprises the step of determining the predetermined amount of reflowable conductive material based on mass of the semiconductor die.

7. A method in accordance with claim 1 wherein step (c) comprises the step of determining the predetermined amount of reflowable conductive material based on number of pads having non-reflowable material thereon.

8. A method in accordance with claim 1 wherein step (c) comprises the step of determining the predetermined amount of reflowable conductive material based on expected final dimensions of reflowed reflowable material.

9. A method in accordance with claim 1 wherein step (c) comprises the step of plating the predetermined amount of reflowable conductive material on the non-reflowable material.

10. A method in accordance with claim 1 further comprising after step (c) and before step (d), the step of applying a cleaning agent.

11. A method in accordance with claim 10 comprising the step of applying a cleaning agent to the reflowable conductive material.

12. A method in accordance with claim 10 wherein step (c) comprises the step of determining the predetermined amount of reflowable conductive material based on material composition of the cleaning agent.

13. A method in accordance with claim 1 wherein step (a) comprises the step of providing the patterned layer of metal conductors having a first surface with a layer of plating thereon.

14. A method in accordance with claim 13 wherein step (c) comprises the step of determining the predetermined amount of reflowable conductive material based on material composition of the layer of plating.

15. A method in accordance with claim 1 wherein step (a) comprises the step of providing the patterned layer of copper conductors.

16. A method in accordance with claim 15 wherein step (a) further comprises the step of providing a layer of plating on the first surface of the patterned layer of copper conductors.

17. A method in accordance with claim 15 wherein step (b) comprises the step of providing a semiconductor die having the first surface with the corresponding pattern of pads thereon, the pads having copper posts thereon and extending therefrom.

18. A method in accordance with claim 17 wherein step (c) comprises the step of disposing a predetermined amount of solder on free ends of the copper posts.

19. A method in accordance with claim 18 after step (c) and before step (d) comprising the step of applying flux to the solder.

20. A method in accordance with claim 19 after the step of applying flux to the solder, the step of cleaning the semiconductor die and the patterned layer of copper conductors.

21. A method in accordance with claim 20 further comprising after the step of cleaning, the step of encapsulating at least a part of the semiconductor die and at least a part of the patterned layer of copper conductors to form a semiconductor package.

22. A method in accordance with claim 21, wherein the patterned layer of copper conductors comprises a portion of a leadframe, wherein the step of encapsulating at least a part of the semiconductor die and at least a part of the patterned layer of copper conductors to form a semiconductor package comprises the step of encapsulating at least the part of the semiconductor die and at least a part of the portion of the leadframe to form the semiconductor package, and further comprises after the step of encapsulating, the step of singulating the semiconductor package from the leadframe.

23. A method in accordance with claim 21 wherein the step of encapsulating comprises the step of molding.

* * * * *